(12) United States Patent
Kim et al.

(10) Patent No.: US 9,099,390 B2
(45) Date of Patent: Aug. 4, 2015

(54) CRYSTALLIZATION APPARATUS, CRYSTALLIZATION METHOD, ORGANIC LIGHT-EMITTING DISPLAY APPARATUS AND METHOD OF MANUFACTURING ORGANIC LIGHT-EMITTING DISPLAY APPARATUS

(75) Inventors: Sung-Ho Kim, Yongin (KR); Do-Young Kim, Yongin (KR); Min-Chul Shin, Yongin (KR); Min-Hwan Choi, Yongin (KR); Jong-Moo Huh, Yongin (KR)

(73) Assignee: Samsung Display Co., Ltd. (KR)

( * ) Notice: Subject to any disclaimer, the term of this patent is extended or adjusted under 35 U.S.C. 154(b) by 445 days.

(21) Appl. No.: 13/451,980

(22) Filed: Apr. 20, 2012

(65) Prior Publication Data

US 2013/0115726 A1    May 9, 2013

(30) Foreign Application Priority Data

Nov. 7, 2011    (KR) .................. 10-2011-0115374

(51) Int. Cl.
| | |
|---|---|
| *H01L 21/00* | (2006.01) |
| *H01L 21/20* | (2006.01) |
| *H01L 21/268* | (2006.01) |
| *H01L 21/67* | (2006.01) |
| *H01L 27/12* | (2006.01) |
| *H01L 27/32* | (2006.01) |

(52) U.S. Cl.
CPC ........ *H01L 21/268* (2013.01); *H01L 21/67115* (2013.01); *H01L 27/1229* (2013.01); *H01L 27/1285* (2013.01); *H01L 27/3262* (2013.01)

(58) Field of Classification Search
CPC ........... H01L 27/1285; H01L 27/3262; H01L 21/268; H01L 21/67115; H01L 27/1229
See application file for complete search history.

(56) References Cited

U.S. PATENT DOCUMENTS

| | | | |
|---|---|---|---|
| 6,759,628 B1 | 7/2004 | Ino et al. | |
| 8,460,986 B2 * | 6/2013 | Toyota et al. | 438/166 |
| 8,575,601 B2 * | 11/2013 | Oh et al. | 257/40 |
| 2004/0232432 A1 | 11/2004 | Sato et al. | |
| 2012/0115316 A1 * | 5/2012 | Park | 438/487 |

FOREIGN PATENT DOCUMENTS

| | | |
|---|---|---|
| JP | 09-321311 | 12/1997 |
| JP | 3580033 | 7/2004 |
| JP | 2004-349415 | 12/2004 |
| KR | 10-20060089828 | 8/2006 |

* cited by examiner

*Primary Examiner* — Bac Au
(74) *Attorney, Agent, or Firm* — Knobbe Martens Olson & Bear LLP

(57) ABSTRACT

A crystallization apparatus for crystallizing a semiconductor layer formed on a substrate, the crystallization apparatus including: a laser generator, which generates a laser beam, and a stage on which the substrate is mounted, where the semiconductor layer is divided into a plurality of crystallization areas and a plurality of non-crystallization areas, and the laser beam is radiated onto the crystallization areas a plurality of times to crystallize the crystallization areas, where the laser beam is radiated onto different positions of the same crystallization area a plurality of times.

10 Claims, 7 Drawing Sheets

CRYSTALLIZATION APPARATUS, CRYSTALLIZATION METHOD, ORGANIC LIGHT-EMITTING DISPLAY APPARATUS AND METHOD OF MANUFACTURING ORGANIC LIGHT-EMITTING DISPLAY APPARATUS

CROSS-REFERENCE TO RELATED APPLICATIONS

This application claims the benefit of Korean Patent Application No. 10-2011-0115374, filed on Nov. 7, 2011, in the Korean Intellectual Property Office, the disclosure of which is incorporated herein in its entirety by reference.

BACKGROUND

1. Field

The present disclosure relates to a crystallization apparatus, a crystallization method, and a method of manufacturing an organic light-emitting display apparatus.

2. Description of the Related Technology

An active matrix (AM) type organic light-emitting display apparatus includes a pixel driving circuit in each pixel, and the pixel driving circuit includes a thin film transistor (TFT) formed of silicon. The silicon forming the TFT includes amorphous silicon or polycrystalline silicon.

An amorphous silicon TFT (a-Si TFT) used in the pixel driving circuit has a structure in which a semiconductor active layer forming a source, a drain, and a channel is formed of amorphous silicon, and thus has a low electron mobility equal to or less than 1 cm$^2$/Vs. Accordingly, recently, a polycrystalline silicon TFT (poly-Si TFT) has been replacing the a-Si TFT. The poly-Si TFT has a higher electron mobility than the a-Si TFT, and has an excellent stability with respect to irradiated light. Thus, the poly-Si TFT is very appropriate to be used as an active layer of a driving and/or switching TFT of the AM type organic light-emitting display apparatus.

The poly-Si TFT can be manufactured by one of various methods, which can be broadly divided into a method of directly depositing polycrystalline silicon, and a method of depositing and crystallizing polycrystalline silicon.

Examples of the method of directly depositing polycrystalline silicon include chemical vapor deposition (CVD), photo CVD, hydrogen radical (HR) CVD, electron cyclotron resonance (ECR) CVD, plasma enhanced (PE) CVD, low pressure (LP) CVD, and the like.

Examples of the method of directly depositing and crystallizing polycrystalline silicon include solid phase crystallization (SPC), excimer laser crystallization (ELC), metal-induced crystallization (MIC), metal-induced lateral crystallization (MILC), sequential lateral solidification (SLS), and the like.

SUMMARY OF CERTAIN INVENTIVE ASPECTS

One or more aspects of the present embodiments provides a crystallization apparatus and a crystallization method that are used to selectively crystallize a partial area on a substrate to improve visibility by removing stains that may be generated during selective crystallization, and a method of manufacturing an organic light-emitting display apparatus.

According to an aspect of the present embodiments, there is provided a crystallization apparatus for crystallizing a semiconductor layer formed on a substrate, the crystallization apparatus including: a laser generator, which generates a laser beam, and a stage on which the substrate is mounted, where the semiconductor layer is divided into a plurality of crystallization areas and a plurality of non-crystallization areas, and the laser beam is radiated onto the crystallization areas a plurality of times to crystallize the crystallization areas, where the laser beam is radiated onto different positions of the same crystallization area a plurality of times.

The crystallization areas and the non-crystallization areas can be repeatedly divided.

The laser beam can be a line beam having a major axis and a minor axis.

The laser beam can be sequentially radiated onto the crystallization areas while being moved in a minor axis direction.

The crystallization areas can be arranged in parallel, and the laser generator is adapted to sequentially radiates a first laser beam onto the crystallization areas and then sequentially radiates a second laser beam onto the crystallization areas.

The second laser beam can be moved more in a major axis direction of the first laser beam than the first laser beam to be radiated onto the crystallization areas.

The laser beam generated by the laser generator can be a pulse laser.

According to another aspect of the present embodiments, there is provided a crystallization apparatus for crystallizing a semiconductor layer formed on a substrate, the crystallization apparatus including: a laser generator which generates a laser beam, and a stage on which the substrate is mounted, where the semiconductor layer is divided into a plurality of crystallization areas and a plurality of non-crystallization areas, and the laser beam is radiated onto the crystallization areas a plurality of times to crystallize the crystallization areas, where the laser beam radiated onto the same crystallization area a plurality of times has different profiles.

The crystallization areas can be arranged in parallel, and the laser generator is adapted to sequentially radiates a first laser beam onto the crystallization areas and then sequentially radiates a second laser beam onto the crystallization areas.

The first laser beam and the second laser beam can have different profiles.

According to another aspect of the present embodiments, there is provided a crystallization method including: mounting a substrate on a stage, wherein a semiconductor layer that is divided into a plurality of crystallization areas and a plurality of non-crystallization areas is formed on a surface of the substrate, and radiating a laser beam onto the crystallization areas a plurality of times, where the radiating of the laser beam includes sequentially radiating the laser beam onto the crystallization areas and then sequentially radiating the laser beam onto the crystallization areas by changing a position of the laser beam.

The crystallization areas and the non-crystallization areas can be repeatedly divided.

The laser beam can be a line beam having a major axis and a minor axis.

The laser beam can be sequentially radiated onto the crystallization areas while being moved in the minor axis direction.

The crystallization areas can be arranged in parallel, and the radiating of the laser beam includes sequentially radiating a first laser beam onto the crystallization areas and then sequentially radiating a second laser beam onto the crystallization areas.

The second laser beam can be moved more in the major axis direction of the first laser beam than the first laser beam to be radiated onto the crystallization areas.

The laser beam can be a pulse laser.

According to another aspect of the present embodiments, there is provided a crystallization method including: mounting a substrate on a stage, where the semiconductor layer is divided into a plurality of crystallization areas and a plurality of non-crystallization areas, and radiating a laser beam onto the crystallization areas a plurality of times, where the radiating of the laser beam includes sequentially radiating the laser beam onto the crystallization areas and then sequentially radiating the laser beam onto the crystallization areas by changing a profile of the laser beam.

The crystallization areas can be arranged in parallel, and the radiating of the laser beam includes sequentially radiating a first laser beam onto the crystallization areas and then sequentially radiating a second laser beam onto the crystallization areas.

The first laser beam and the second laser beam can have different profiles.

According to another aspect of the present embodiments, there is provided a method of manufacturing an organic light-emitting display apparatus, the method including the crystallizing method, where the organic light-emitting display apparatus includes a plurality of pixels having channel regions, storage regions, and emission regions, respectively, and the performing of the crystallization includes crystallizing only the channel regions and the storage regions.

BRIEF DESCRIPTION OF THE DRAWINGS

The above and other features and advantages of the present embodiments will become more apparent by describing in detail certain embodiments with reference to the attached drawings in which.

DETAILED DESCRIPTION OF CERTAIN INVENTIVE EMBODIMENTS

The present invention will now be described more fully with reference to the accompanying drawings, in which certain embodiments of the invention are shown. The invention can, however, be embodied in many different forms and should not be construed as being limited to the embodiments set forth herein; rather, these embodiments are provided so that this disclosure will be thorough and complete, and will fully convey the concept of the invention to one of ordinary skill in the art. As used herein, the term "and/or" includes any and all combinations of one or more of the associated listed items.

Figure 1:
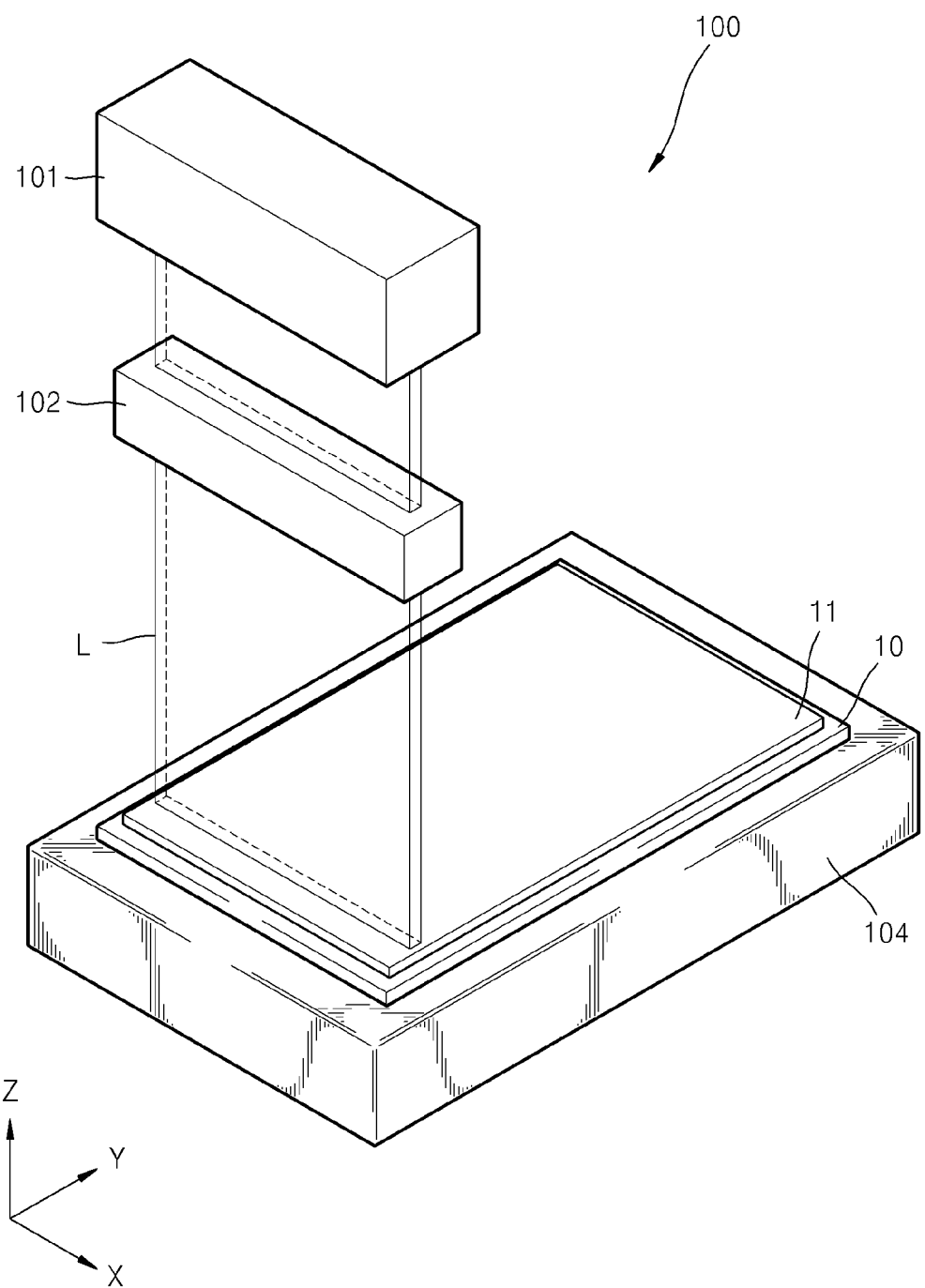
FIG. 1 is a view schematically showing an embodiment of a crystallization apparatus.

FIG. 1 is a view schematically showing an embodiment of a crystallization apparatus 100.

Referring to FIG. 1, an embodiment of the crystallization apparatus 100 can include a laser generating device 101 for generating a laser beam L, an optical system 102 for processing the laser beam L generated by the laser generating device 101, and a stage 104 on which a substrate 10 is mounted.

The optical system 102 can include an attenuator (not shown) for adjusting the energy magnitude of the unprocessed laser beam L, a focusing lens (not shown) for focusing the laser beam L, a reducing lens (not shown) for reducing the laser beam L that has passed through the focusing lens at a predetermined ratio, and the like.

The stage 104 can be disposed to correspond to the laser generating device 101. The substrate 10, deposited with a semiconductor layer 11 which is an amorphous silicon layer, can be fixed onto the stage 104. The stage 104 can be moved in a major axis direction, such as, for example, in an x-axis direction, of the laser beam L, which will be described below.

A configuration of an organic light-emitting display apparatus manufactured using the above-described crystallization apparatus is described below.

Figure 2:
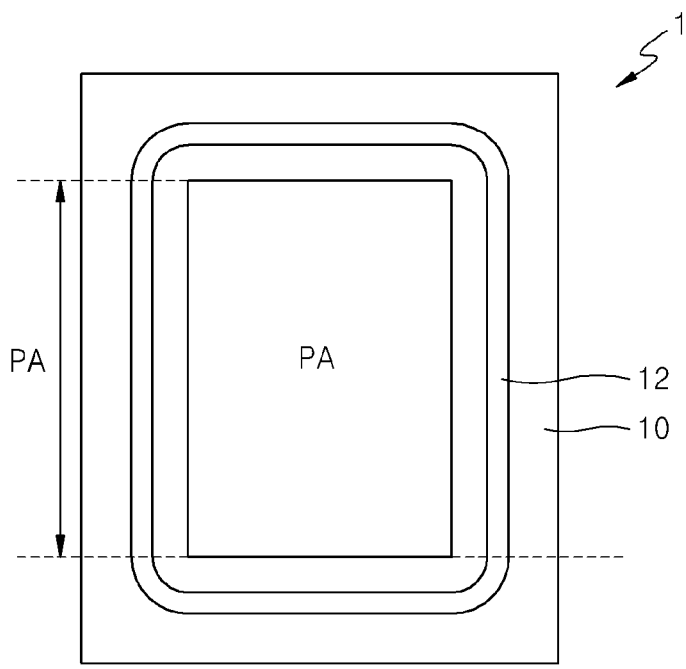
FIG. 2 is a plane view schematically showing an organic light-emitting display apparatus manufactured using the crystallization apparatus of FIG. 1.
Figure 3:
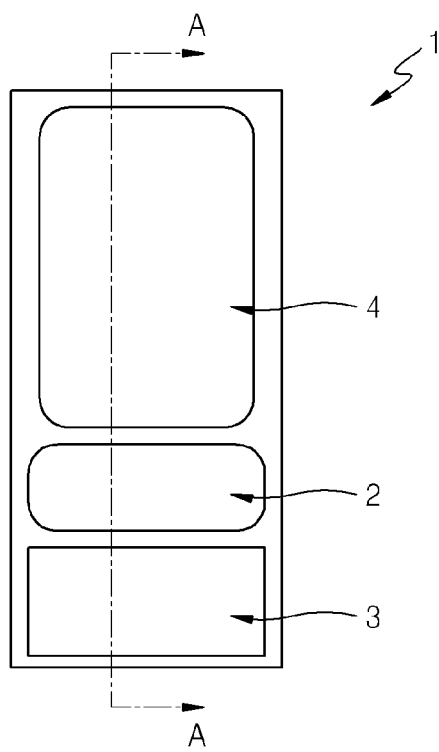
FIG. 3 is a plane view showing one pixel constituting the organic light-emitting display apparatus 1 of FIG. 2.
Figure 4:
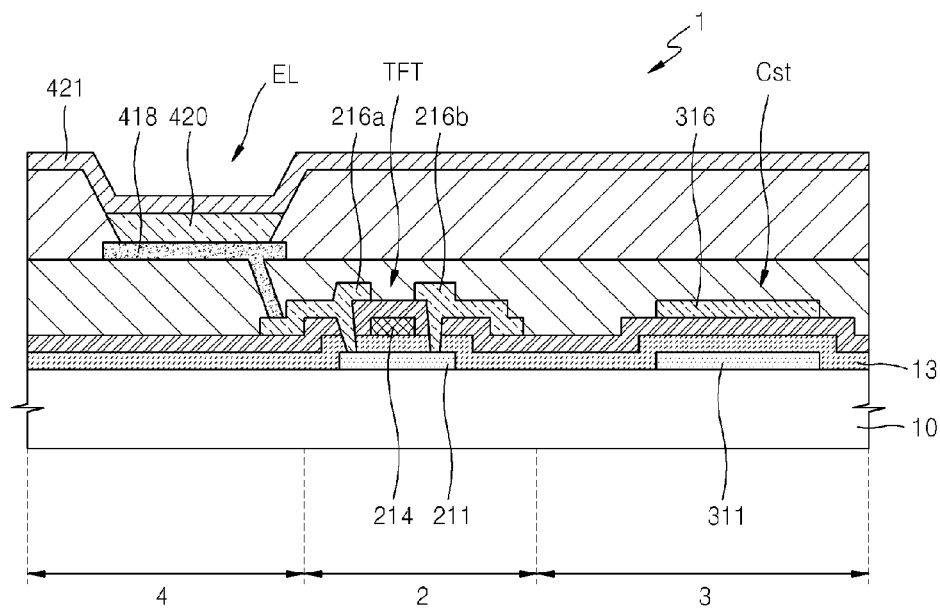
FIG. 4 is a cross-sectional view taken along line A-A of FIG. 3.

FIG. 2 is a plane view schematically showing an embodiment of an organic light-emitting display apparatus 1 manufactured using the crystallization apparatus of FIG. 1. FIG. 3 is a plane view showing one pixel constituting the organic light-emitting display apparatus 1 of FIG. 2. FIG. 4 is a cross-sectional view taken along line A-A of FIG. 3.

Referring to FIG. 2, an embodiment of the organic light-emitting display apparatus 1 includes a first substrate 10 including a thin film transistor (TFT), an organic light-emitting device, and the like, and a second substrate (not shown) coupled to the first substrate 10 through sealing.

A plurality of pixels each including a TFT, an organic electroluminescent (EL) device, a storage capacitor Cst, and other elements can be formed on the first substrate 10. The first substrate 10 can be a low temperature poly-Si (LTPS) substrate, a glass substrate, a plastic substrate, a stainless using steel (SUS) substrate, or the like.

The second substrate can be an encapsulation substrate disposed on the first substrate 10 so as to block the TFT, the organic EL device, and other elements that are on the first substrate 10 from external moisture, air, and other contaminants. The second substrate is disposed to face the first substrate 10, and the first substrate 10 and the second substrate are bonded to each other by a sealing member 12 disposed along an edge thereof. The second substrate can be a glass substrate, or a plastic substrate, which is transparent.

The first substrate 10 includes a pixel area PA from which light is emitted and a circuit area (not shown) formed around the pixel area PA. According to various embodiments, the sealing member 12 is disposed in the circuit area formed around the pixel area PA to bond the first substrate 10 and the second substrate to each other.

In some embodiments of the organic light-emitting display apparatus 1, selective crystallization can be performed on a semiconductor layer of the pixel area PA, which is described below.

Referring to FIGS. 3 and 4, one pixel of the organic light-emitting display apparatus 1 shown in FIG. 2 includes a channel area 2, a storage area 3, and an emission area 4. FIG. 3 shows that the channel area 2, the storage area 3, and the emission area 4 formed in parallel in one direction. In other embodiments, the storage area 3 and the emission area 4 can be formed long in a lengthwise direction to be adjacent to each other, and the channel area 2 can be formed at one side thereof to be adjacent to each of the storage area 3 and the emission area 4. The semiconductor layer 11 corresponding to the channel area 2 and the storage area 3 is crystallized, and the semiconductor layer 11 corresponding to the emission area 4 is not crystallized. In some embodiments, the semiconductor layer 11 is selectively crystallized, and after the selective crystallization, the semiconductor layer 11 corresponding to the emission area 4 can be removed, which is described.

Referring to FIG. 4, the TFT, as a driving device, is included in the channel area 2. The TFT includes an active layer 211, a gate electrode 214, and source and drain electrodes 216a and 216b. A first insulating layer 13 is interposed between the gate electrode 214 and the active layer 211 so as to insulate them from each other. Also, source and drain regions to which high density impurities are injected are formed in both ends of the active layer 211, and the source and drain regions are connected to the source and drain electrodes 216a and 216b, respectively.

The storage capacitor Cst is included in the storage area 3. The storage capacitor Cst includes a capacitor first electrode 311 and a capacitor second electrode 316, and the first insulating layer 13 is interposed between the capacitor first electrode 311 and the capacitor second electrode 316. The capacitor first electrode 311 and the active layer 211 of the TFT can be formed of the same material and on the same layer. The capacitor second electrode 316 and the source and drain electrodes 216a and 216b of the TFT can be formed of the same material and on the same layer.

The organic EL device is included in the emission area 4. The organic EL device includes a pixel electrode 418 connected to any one of the source and drain electrodes 216a and 216b of the TFT, a counter electrode 421 formed to face the pixel electrode 418, and an intermediate layer 420 interposed between the pixel electrode 418 and the counter electrode 421. The pixel electrode 418 is formed of a transparent conductive material.

According to some known methods, an entire area of a pixel area, such as for example, all of a channel area, a storage area, and an emission area are crystallized. However, as an organic light-emitting display apparatus becomes larger, an area to be crystallized also becomes larger, so that maintenance costs involving generation of a laser by a laser generating device are increased, and productivity is decreased.

An area that requires a high electron mobility in one pixel is only the channel area 2 and the storage area 3, and the emission area 4 that occupies an area more than a half of an entire area of the pixel does not require the high electron mobility. Accordingly, to crystallize only the channel area 2 and the storage area 3 is highly recommended in terms of the maintenance costs of the laser.

Also, according to some known crystallization methods, laser beams having uniform widths are radiated in such a way that the laser beams partially overlap with each other to crystallize an entire substrate. In the areas that are radiated by the laser beams partially overlapping with each other, sizes of crystals are not uniform, and an electrical characteristic is not constant. Also, a boundary line that is incurred by the overlapped laser beams can be recognized as a stain to a user.

Thus, embodiments of the organic light-emitting display apparatus 1 are characterized by a feature in which a polycrystalline silicon active layer is formed by selectively crystallizing only the semiconductor layer 11 to be formed in the channel region 2 and the storage region 3, and by not performing crystallization on the semiconductor layer 11 to be formed in the emission region 4. While a substrate and a laser generating device are relatively moved with respect to each other, if the substrate or the laser generating device passes a portion to be crystallized, such as for example, the channel region 2 and the storage region 3, crystallization is performed. In this manner, by performing the selective crystallization, an efficiency of the laser generating device can be maximized, maintenance costs can be reduced, and productivity can be improved.

Selective crystallization is performed using a laser beam that has a major axis and minor axis, and is formed in the form of a line beam. For example, while laser beam is moving in a minor axis direction, the laser beam is radiated onto the channel area 2 and the storage area 3. The laser beam does not have energy that is not constant in a major axis direction of the laser beam due to non-uniformity of an optical system, and a line stain is formed in a direction in which the laser beam is moved.

Figure 5:
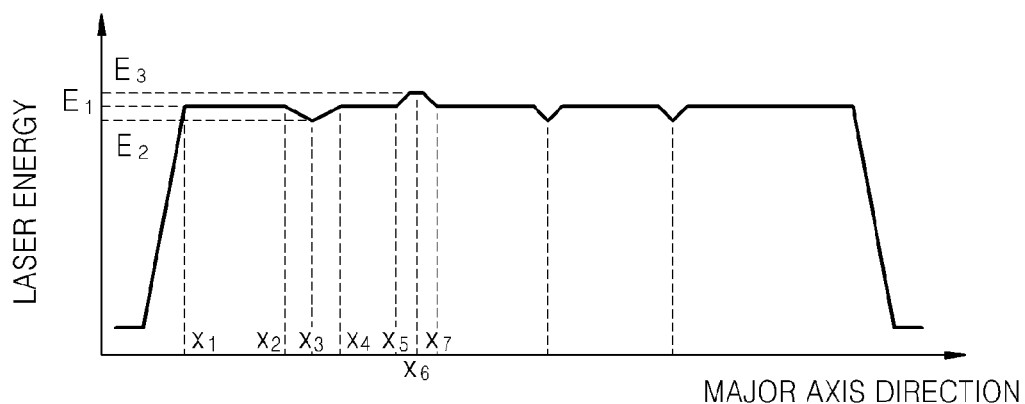
FIG. 5 is a graph showing energy with respect to a major axis direction of a laser beam having different energy magnitudes, according to one embodiment.
Figure 6:
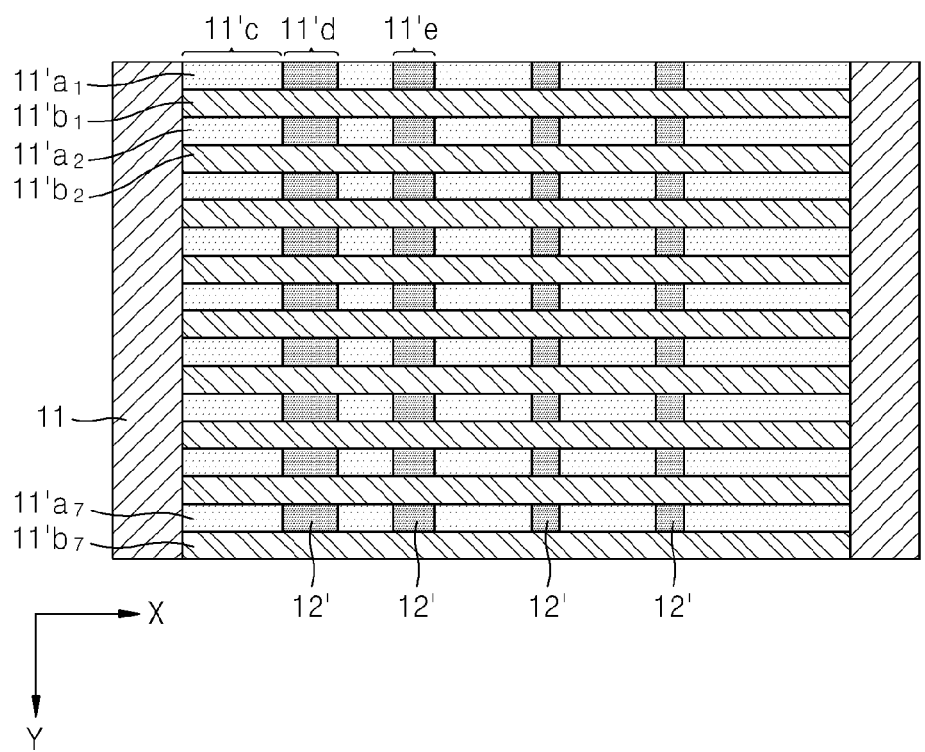
FIG. 6 is a plane view schematically showing a semiconductor layer that is selectively crystallized by the laser beam of FIG. 5.

FIG. 5 is a graph showing energy magnitudes of a laser beam according to a major axis direction of the laser beam, according to one embodiment. FIG. 6 is a plane view schematically showing a semiconductor layer 11' that is selectively crystallized by the laser beam of FIG. 5.

Referring to FIG. 5, the energy magnitude of the laser beam in the major axis direction is not constant. The laser beam has the energy magnitude of E1 between a position x1 and a position x2 in the major axis direction, has the energy magnitude of E2, which is smaller than E1, at a position x3, and has the energy magnitude of E3, which is larger than E1, at a position x6. While the laser beam having a non-uniform energy distribution is moving in a minor axis direction, such as for example, a y-axis direction, the laser beam is radiated onto crystallization areas 11'a1 through 11'an of the semiconductor layer 11', as shown in FIG. 6, to crystallize the crystallization areas 11'a1 through 11'an.

Since the laser beam has the energy magnitude that is not constant in the major axis direction, degrees of the crystallization performed in the crystallization areas 11'a1 through 11'an are different from one another. For example, looking at the energy of the laser beam between the position x2 and the position x4, since the energy E2 of the laser beam at the position x3 is smaller than the energy E1 of the laser beam between the position x1 and the position x2, a degree of crystallization of an area 11'd of the semiconductor layer 11' onto which the laser beam between the position x2 and the position x4 is radiated is smaller than a degree of crystallization of an area 11'c of the semiconductor layer 11' onto which the laser beam between the position x1 and the position x2 is radiated. Also, looking at the energy of the laser beam between the position x5 and the position x7, since the energy E3 of the laser beam at the position x6 is larger than the energy E1 of the laser beam between the position x1 and the position x2, a degree of crystallization of an area 11'e of the semiconductor layer 11' onto which the laser beam between the position x5 and the position x7 is radiated is larger than a degree of crystallization of the area 11'c of the semiconductor layer 11' onto which the laser beam between the position x1 and the position x2 is radiated.

As such, a laser beam having an energy magnitude that is not constant is moved in the minor axis direction, such as for example the y-axis direction, and the laser beam is selectively radiated onto the crystallization areas 11'a1 through 11'an, and thus a line stain 12' is generated in a scanning direction of the laser beam, i.e., in an y-axis direction due to a difference in the degree of crystallization, thereby decreasing visibility of the organic light-emitting display apparatus.

Figure 7:
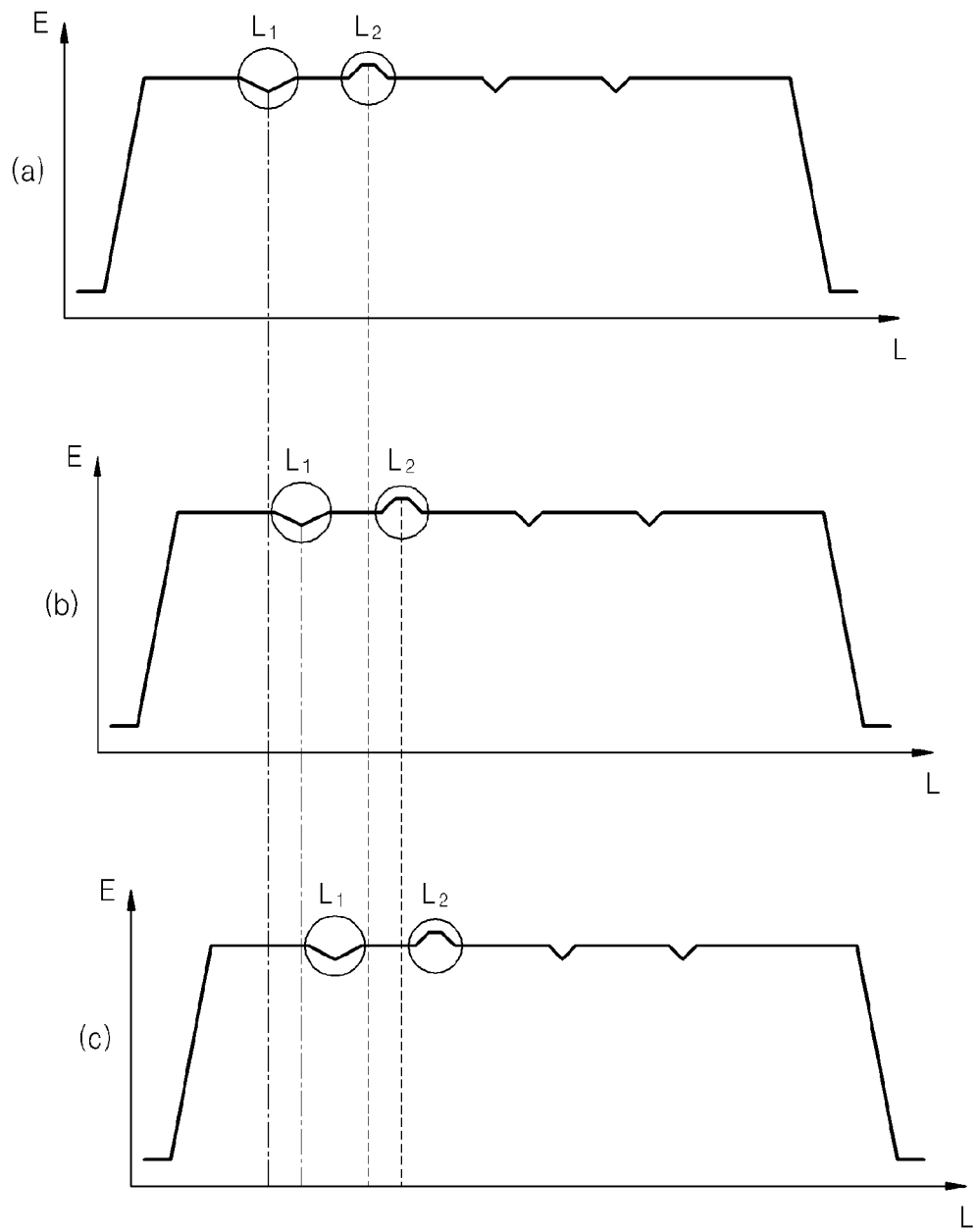
FIGS. 7A through 7C are graphs showing energy of laser beams according to one embodiment.

In order to resolve the above-described problem, according to some embodiments, a laser beam is radiated in different positions of the same crystallization area, which is described with reference to FIGS. 7 and 8.

FIGS. 7A through 7C are graphs showing energy of laser beams according to an embodiment. FIG. 8 is a plane view schematically showing the semiconductor layer 11 that is selectively crystallized by the laser beams of FIGS. 7A through 7C.

Figure 8:
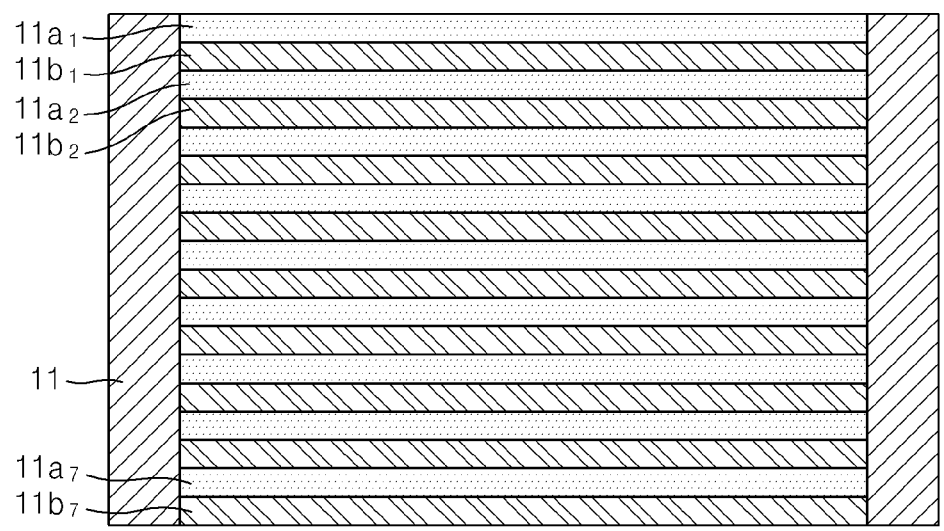
FIG. 8 is a plane view schematically showing a semiconductor layer that is selectively crystallized by the laser beams of FIG. 7.

First, the laser beam shown in FIG. 7A is sequentially radiated onto the crystallization areas 11a1 through 11an of the semiconductor layer 11 of FIG. 8. Next, as shown in FIG. 7B, the laser beam is moved in a major axis direction L, and then is sequentially radiated onto the crystallization areas 11a1 through 11an of the semiconductor layer 11 of FIG. 8. Then, as shown in FIG. 7C, the laser beam is moved more in the major axis direction L than the laser beam of FIG. 7B and is sequentially radiated onto the crystallization areas 11a1 through 11an of the semiconductor layer 11 of FIG. 8. As such, the laser beam is moved in the major axis direction L and is radiated onto the semiconductor layer 11, and thus portions $L_1$ and $L_2$ of the laser beam having different energy magnitudes are prevented from being repeatedly radiated onto the same area of the semiconductor layer 11, thereby preventing formation of a line stain, as described above.

FIGS. 7A through 7C show three laser beams that are different in position in the major axis direction L. In other embodiments, four or more laser beams can be sequentially radiated onto the crystallization areas 11a1 through 11an of the semiconductor layer 11.

FIGS. 7A through 7C show the laser beams that are moved only in a positive major axis direction +L, but the laser beams can be randomly moved in the major axis direction L and can be radiated onto the semiconductor layer 11. For example, after a first radiation of the laser beams is performed, the laser beams can be radiated while being moved in a negative major axis direction –L. Alternatively, after the first radiation of the laser beams is performed, a second radiation of the laser beams can be performed in the positive major axis direction +L, and a third radiation of the laser beams can be performed in the negative major axis direction –L As described above, the laser beam can be moved in the major axis direction L. Alternatively, the stage 104 can be moved in the major axis direction of the laser beam, such as for example in the x-axis direction of FIG. 1, without moving the laser beam in the major axis direction.

Figure 9:
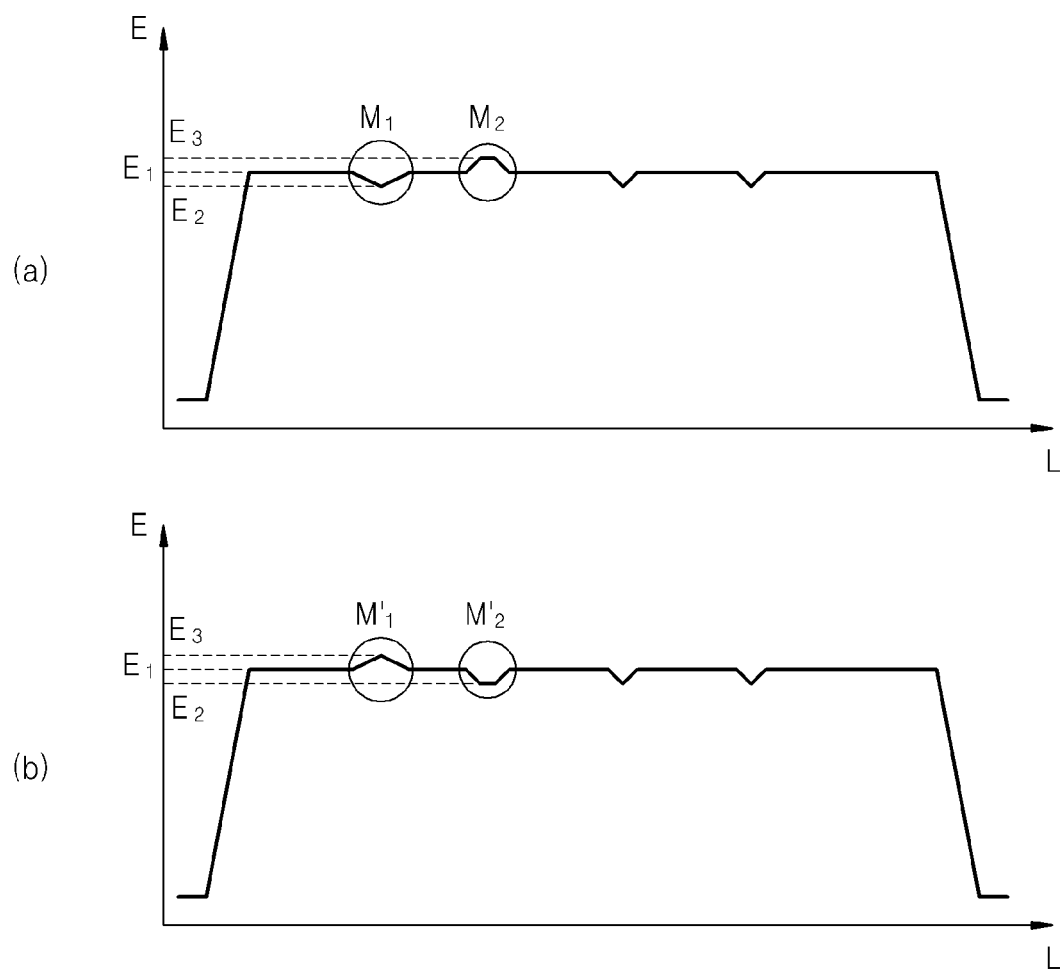
FIGS. 9A and 9B are graphs showing energy of a laser beam according to another embodiment.

Alternatively, the laser beam can be radiated onto the crystallization areas 11a1 through 11an of the semiconductor layer 11 of FIG. 8 by changing a profile (energy distribution) of the laser beam for each radiation and not by moving the laser beam in the major axis direction. In detail, referring to FIG. 9A, the laser beam of the first radiation has the energy magnitude of E2, which is relatively small, at a portion $M_1$ and the energy magnitude of E3, which is relatively large, at a portion $M_2$. The laser beam of FIG. 9A is sequentially radiated onto the crystallization areas 11a1 through 11an of the semiconductor layer 11 of FIG. 8. Then, as shown in FIG. 9B, the laser beam has a profile that is different from that of the laser beam of FIG. 9A, and the laser beam is sequentially radiated onto the crystallization areas 11a1 through 11an of the semiconductor layer 11 of FIG. 8. That is, as shown in FIG. 9B, the laser beam of the second radiation has the energy magnitude of E3, which is relatively large, at a portion $M'_1$ and has the energy magnitude of E2, which is relatively small, at a portion $M'_2$. Although not shown, a laser beam of a third radiation can have a profile that is different from that of the laser beams shown in FIGS. 9A and 9B.

As such, the laser beam can be radiated onto the semiconductor layer 11 by changing a profile of the laser beam, and thus the portions $M_1$ and $M_2$ of the laser beam having different energy magnitudes are prevented from being repeatedly radiated onto the same area of the semiconductor layer 11, thereby preventing formation of a line stain, as described above.

A laser beam generated by the laser generating device 101 of the crystallization apparatus 100 can be, instead of a conventional continuous wave laser, a pulse laser. For example, in a case where the laser generating device 101 generates a pulse laser having a frequency of 6000 Hz, a high frequency laser is irradiated 6000 times to the substrate 10 per one second.

According to embodiments of the present invention, a line stain is prevented from being formed during selective crystallization, and thus visibility of the organic light-emitting display apparatus can be improved.

While the present invention has been particularly shown and described with reference to certain embodiments thereof, it will be understood by those of ordinary skill in the art that various changes in form and details can be made therein without departing from the spirit and scope of the present invention as defined by the following claims.

What is claimed is:

1. A method of manufacturing an organic light-emitting display apparatus, the method comprising:
    mounting a substrate on a stage, wherein a semiconductor layer that is divided into a plurality of crystallization areas and a plurality of non-crystallization areas is formed on a surface of the substrate; and
    radiating a laser beam onto the crystallization areas a plurality of times,
    wherein the radiating of the laser beam comprises sequentially radiating the laser beam onto the crystallization areas and then sequentially radiating the laser beam onto the crystallization areas by changing a position of the laser beam,
        wherein the organic light-emitting display apparatus comprises a plurality of pixels having channel regions, storage regions, and emission regions, respectively, and
        the performing of the crystallization comprises crystallizing only the channel regions and the storage regions.

2. The method of claim 1, wherein the crystallization areas and the non-crystallization areas are repeatedly divided.

3. The method of claim 1, wherein the laser beam is a line beam having a major axis and a minor axis.

4. The method of claim 3, wherein the laser beam is sequentially radiated onto the crystallization areas while being moved in the minor axis direction.

5. The method of claim 3, wherein the crystallization areas are arranged in parallel, and the radiating of the laser beam comprises sequentially radiating a first laser beam onto the crystallization areas and then sequentially radiating a second laser beam onto the crystallization areas.

6. The method of claim 5, wherein the second laser beam is moved more in the major axis direction of the first laser beam than the first laser beam to be radiated onto the crystallization areas.

7. The method of claim 1, wherein the laser beam is a pulse laser.

8. A method of manufacturing an organic light-emitting display apparatus, the method comprising:
    mounting a substrate on a stage, wherein the semiconductor layer is divided into a plurality of crystallization areas and a plurality of non-crystallization areas; and
    radiating a laser beam onto the crystallization areas a plurality of times, wherein the radiating of the laser beam comprises sequentially radiating the laser beam onto the crystallization areas and then sequentially radiating the laser beam onto the crystallization areas by changing a profile of the laser beam, wherein the organic light-emitting display apparatus comprises a plurality of pixels having channel regions, storage regions, and emission regions, respectively, and the performing of the crystallization comprises crystallizing only the channel regions and the storage regions.

9. The method of claim 8, wherein the crystallization areas are arranged in parallel, and the radiating of the laser beam comprises sequentially radiating a first laser beam onto the crystallization areas and then sequentially radiating a second laser beam onto the crystallization areas.

10. The method of claim 9, wherein the first laser beam and the second laser beam have different profiles.

* * * * *